(12) United States Patent
Yakuzawa et al.

(10) Patent No.: US 12,279,392 B2
(45) Date of Patent: Apr. 15, 2025

(54) ELECTRONIC CONTROL DEVICE

(71) Applicant: Hitachi Astemo, Ltd., Hitachinaka (JP)

(72) Inventors: Kenta Yakuzawa, Hitachinaka (JP); Toshikazu Shigyo, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 204 days.

(21) Appl. No.: 18/011,237

(22) PCT Filed: Feb. 5, 2021

(86) PCT No.: PCT/JP2021/004262
§ 371 (c)(1),
(2) Date: Dec. 19, 2022

(87) PCT Pub. No.: WO2021/260992
PCT Pub. Date: Dec. 30, 2021

(65) Prior Publication Data
US 2023/0254990 A1   Aug. 10, 2023

(30) Foreign Application Priority Data

Jun. 22, 2020   (JP) ................................ 2020-107071

(51) Int. Cl.
*H05K 5/00* (2006.01)
*B60R 16/023* (2006.01)
*H05K 5/06* (2006.01)

(52) U.S. Cl.
CPC ......... *H05K 5/062* (2013.01); *B60R 16/0239* (2013.01); *H05K 5/0052* (2013.01); *H05K 5/061* (2013.01)

(58) Field of Classification Search
CPC ....... H05K 5/062; H05K 5/0052; H05K 5/061
(Continued)

(56) References Cited

U.S. PATENT DOCUMENTS

2013/0271933 A1* 10/2013 Tanaka ................. H05K 5/0052
361/752
2016/0165736 A1*  6/2016 Tsuboi .................... H02K 11/33
174/50.54
(Continued)

FOREIGN PATENT DOCUMENTS

JP         64-26885    *  2/1989   ............... H05K 5/06
JP         64-26885 U     2/1989
(Continued)

OTHER PUBLICATIONS

International Search Report (PCT/ISA/210) issued in PCT Application No. PCT/JP2021/004262 dated May 25, 2021 with English translation (six (6) pages).
(Continued)

*Primary Examiner* — Zhengfu J Feng
(74) *Attorney, Agent, or Firm* — Crowell & Moring LLP (57) ABSTRACT

Provided is an electronic control device capable of suppressing outflow of a sealing material to the outside and reducing defective attachment of a bracket.
The electronic control device 1 to be attached to a bracket 2 includes a cover 4 (first housing) and a case 3 (second housing) fitted to the cover 4. The cover 4 (first housing) includes a first flange 4F and a first groove portion 31 filled with a sealing material 5. The case 3 (second housing) includes a second flange 3F overlapping the first flange 4F, and a case protrusion 33 (protrusion) fitted to the first groove portion 31 and embedded in the sealing material 5. The first flange 4F of the cover 4 (first housing) has a second groove portion 41 present at a position that is closer to the outside than the first groove portion 31 is.

14 Claims, 7 Drawing Sheets

(58) Field of Classification Search
USPC .......................................................... 361/752
See application file for complete search history.

(56) References Cited

U.S. PATENT DOCUMENTS

| 2018/0192526 A1* | 7/2018 | Suzuki ................. H05K 5/0052 |
| 2018/0222408 A1* | 8/2018 | Shigyo ................ B60R 16/0239 |

FOREIGN PATENT DOCUMENTS

| JP | 2-58354 A | 2/1990 |
| JP | 5-556 U | 1/1993 |
| JP | 6-186104 A | 7/1994 |
| JP | 2007-24771 A | 2/2007 |
| JP | 2011-204974 A | 10/2011 |
| JP | 2011-205002 A | 10/2011 |
| JP | 2012-227217 A | 11/2012 |
| JP | 2015-162624 A | 9/2015 |
| JP | 2016-109172 A | 6/2016 |
| JP | 2018-116953 A | 7/2018 |
| WO | WO 2017/038316 A1 | 3/2017 |

OTHER PUBLICATIONS

Japanese-language Written Opinion (PCT/ISA/237) issued in PCT Application No. PCT/JP2021/004262 dated May 25, 2021 (five (5) pages).

* cited by examiner

ELECTRONIC CONTROL DEVICE

TECHNICAL FIELD

The present invention relates to an electronic control device.

BACKGROUND ART

There are many requirements for an electronic control device mounted in an engine room, such as waterproof, heat resistance, corrosion resistance, vibration, and EMC. In addition, the lifetime required for the product is also extended, and it is necessary to guarantee the operation even in a severe usage environment. In addition, the size of the control device is increased with the advancement of functionality of a vehicle, and inexpensive and high-quality design is required. In addition, in order to improve the degree of freedom in attachment, versatility, and workability of customers, a shape in which a bracket can be attached according to a vehicle type is required.

Even in the above environment, it is necessary to provide a large contact area between the bracket and the electronic control device so that the electronic control device having an increased size and an increased weight can be attached. Therefore, in order to secure the contact area, there is a demand for a shape having a contact portion in which a case and a cover face each other and are flush with each other and a side surface formed on an outer end surface of the contact portion. Furthermore, since the product is assumed to be mounted in an engine room, there is a high quality requirement for a completely airtight structure. Therefore, at the manufacturing site, a product with a high yield in a process of applying a sealing material and can easily be manufactured to ensure high quality is required.

CITATION LIST

Patent Literature

PTL 1: JP 2016-109172 A
PTL 2: JP 2012-227217 A
PTL 3: WO 2017-038316 A

SUMMARY OF INVENTION

Technical Problem

The electronic control device has a shape in which a bracket is assumed to be attached. In addition, the size is 260 mm×240 mm, which is 1.5 times larger than that of a conventional electronic control device, and the weight is also increased to about 1.8 kg. Since the product is mounted in an engine room of a vehicle in a state where the size and weight of the product are increased, it is necessary to fix the product to the vehicle via a bracket even in a high vibration environment.

In addition, in order to attach the bracket, it is necessary to provide a large contact area of the bracket, and a shape having a contact portion in which the case and the cover face each other and are flush with each other and having a side surface on the outer end surface of the contact portion is adopted. In addition, since the bracket attachment surface needs to secure flat portions of the case and the cover in parallel by about 10 mm, the case and the cover have flat portions of about 10 mm.

In addition, in order to fix the flat portions of the case and the cover by bringing the bracket into contact with the upper and lower flat portions, a low-profile shape having a thickness of about 10 mm when the case and the cover are in contact with each other while facing each other is adopted, and the shape is a shape in which the bracket is assumed to be attached by bringing the bracket into contact with three surfaces of the flat portions of the case and the cover and the side surfaces of the case and the cover. The sealing material filled in a sealing groove flows out to the side surface of the outer end surface of the contact portion to which the bracket is attached at the time of the assembly of the case and the cover, so that the sealing material has a protruding shape, which leads to a dimensional defect of the product. Therefore, since the sealing material that has flowed out has a protruding shape, the bracket cannot be correctly attached, and a problem with defective attachment occurs.

In addition, in a case where the case and the cover are flush with each other, since the sealing groove is provided on the inner side of the contact surface between the case and the cover, there is a problem that whether the sealing material filled is present or not cannot be visually determined in terms of appearance. In addition, in order to confirm whether the sealing material filled is present or not, disassembly is required, and thus it is not possible to confirm whether the sealing material filled is present or not at the manufacturing site. In addition, since the size of the electronic control device is increased, it is difficult to manage based on the amount of the sealing material applied, the viscosity of the sealing material is greatly affected by the lot and the use environment, and thus there is a problem that insufficient filling of the sealing material occurs. However, the sealing material is a high-cost component among components included in an electronic control device, and cannot be used in an increased amount. Therefore, there is a demand for a product with high quality and good yield that can withstand even in a severe environment with a small amount used.

In the structure disclosed in PTL 1, in order to prevent the inflow of the sealing material in the housing in which the printed wiring substrate is housed due to the flow of the sealing material at the time of assembly, a groove for storing the sealing material that has flowed out is provided on the printed wiring substrate side of the case or the cover, and a part of the sealing material that has flowed out is stored, so that an extra sealing material is prevented from entering the housing to prevent a short circuit of the electronic components.

However, in the structure of PTL 1, it is possible to prevent the sealing material from flowing out to the printed wiring substrate side, but the sealing material flows out to the outside opposite to the printed wiring substrate side, and when the bracket is attached, there is a possibility that the sealing material that has flowed out affects the attachment of the bracket, and thus the shape cannot be adopted for the electronic control device. In addition, since it does not have a long and low height shape necessary for use as a bracket attachment surface, it is difficult to attach the bracket with the shape of PTL 1, and thus the problem of the electronic control device cannot be solved. Therefore, there is a difference from the present invention.

The structure disclosed in PTL 2 has a contact portion in which a case and a cover face each other and are flush with each other, and has a shape in which a side surface is formed on an outer end surface of the contact portion, and has a structure in which a sealing material that has flowed out to the side surfaces of the case and the cover at the time of assembling the case and the cover has a protruding shape, which causes a problem equivalent to that of the present electronic control device. As a measure against the protruding shape of the sealing material, a groove for storing the sealing material flowing out to side surfaces of the case and the cover is provided on the side surface of the case or the cover to prevent dimensional defects due to the flowing out of the sealing material. However, it is difficult to attach a bracket, and PTL 2 cannot solve a problem that occurs when the bracket is attached, and thus is different from the present invention.

In the structure disclosed in PTL 3, since a bracket is attached, an attachment portion has a low height. However, depending on variations in manufacturing and dimensional variations of a case, a cover, and the like, a sealing material largely flows out to a bracket attachment surface, which may affect the attachment of the bracket. PTL 2 is a patent proposal that cannot solve the problem that occurs when the bracket is attached, and thus is different from the present proposal.

An object of the present invention is to provide an electronic control device capable of suppressing outflow of a sealing material to the outside and reducing defective attachment of a bracket.

Solution to Problem

In order to achieve the above object, the present invention is an electronic control device to be attached to a bracket and including a first housing and a second housing fitted to the first housing, in which the first housing includes a first flange and a first groove portion filled with a sealing material, the second housing includes a second flange overlapping the first flange and a protrusion fitted to the first groove portion and embedded in the sealing material, and the first flange or the second flange includes a second groove portion at a position that is closer to an outside than the first groove portion is.

Advantageous Effects of Invention

According to the present invention, it is possible to suppress a sealing material from flowing out to the outside and to reduce defective attachment of a bracket. Problems, configurations, and effects other than those described above will be clarified from the following description of embodiments.

DESCRIPTION OF EMBODIMENTS

Hereinafter, configurations and operational effects of electronic control devices according to Examples 1 to 6 of the present invention will be described with reference to the drawings. The electronic control devices control, for example, an engine, a transmission, and the like. In the drawings, the same reference numerals denote the same parts.

An object of the present Example partially overlaps with an object of the invention, but the object of the present Example is to provide an electronic control device having a structure in which a sealing material is prevented from flowing out to the outside by accumulating the sealing material in a groove provided in a case or a cover in order to prevent the sealing material from overflowing to a flat portion and a side portion to which a bracket is attached, and the flow of the sealing material is controlled by using a pressure at the time of assembling the case and the cover, so that only a part of the sealing material is allowed to flow out to the outside at a place that does not affect the attachment of the bracket, and a worker on site can visually check the outflow portion and check whether the sealing material filled is present or not.

EXAMPLE 1

Figure 1:
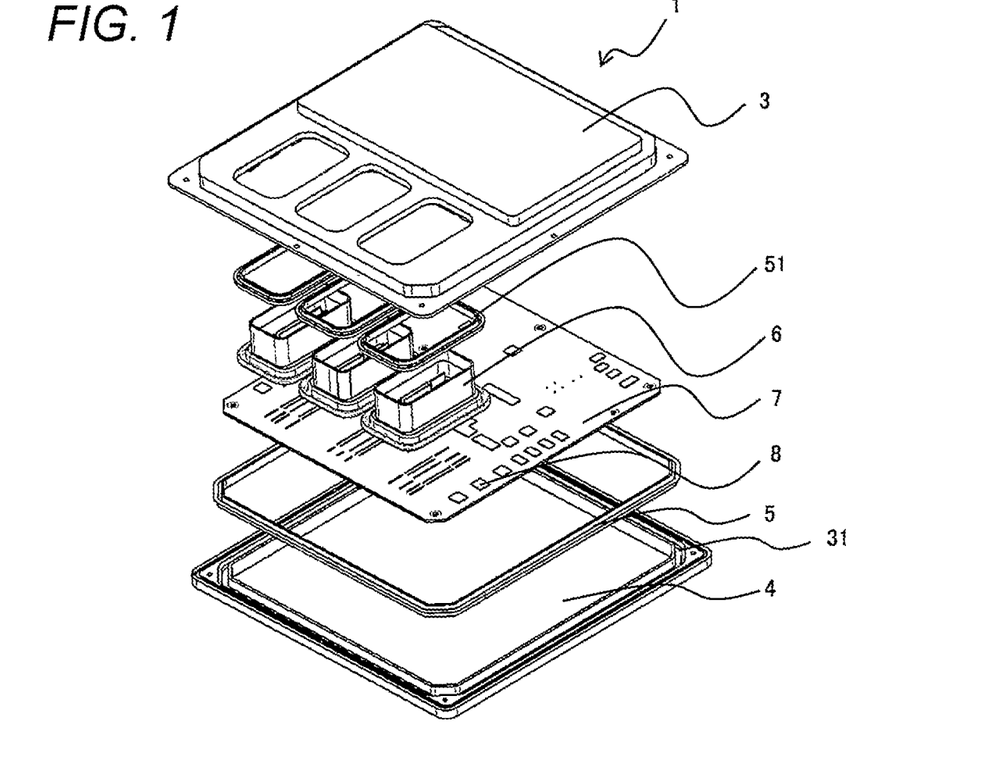
FIG. 1 is a perspective view of an electronic control device according to Example 1 of the present invention.

FIG. 1 is a perspective view of an electronic control device 1 according to Example 1 of the present invention. In order to make the drawings easily viewable, electronic components and the like mounted on a substrate are omitted.

As illustrated in FIG. 1, the electronic control device 1 mainly includes a printed wiring substrate 7, a case 3, a cover 4, a sealing material 5, and three connectors 6.

Electronic components and the like are mounted on the printed wiring substrate 7. The case 3 protects the printed wiring substrate 7. In the case 3, at least three openings through which the connectors 6 are inserted are provided on a flat surface.

The case 3 is fixed to the cover 4 to seal the opening of the case 3. The connectors 6 are electrically connected to the printed wiring substrate 7. The sealing material 5 waterproofs between the opening edge portion of the case 3 and the inner surface of the peripheral edge portion of the cover 4. A connector sealing material 51 waterproofs between housing grooves of the connectors 6 and protrusions around the plurality of openings of the case 3 through which the connectors 6 penetrate.

The printed wiring substrate 7 is fixed to the case 3 with a screw. Here, a heat dissipation adhesive is interposed between the printed wiring substrate 7 and the case 3. The cover 4 is fixed to the case 3 with a screw and an adhesive.

The case 3 accommodates the printed wiring substrate 7 therein together with the cover 4, and protects the printed wiring substrate 7 on which the electronic components are mounted from water, foreign matters, and the like. The case 3 and the cover 4 are preferably made of metal and preferably made of aluminum in order to dissipate heat generated by the electronic components and to shield noise. In order to dissipate heat generated by the electronic components, the heat of the electronic components is dissipated from the case 3 or the cover 4 via the printed wiring substrate 7 and a heat dissipation adhesive 8. Therefore, a base 48 (see FIG. 9) to which the heat dissipation adhesive 8 is applied is provided on the case 3 or the cover 4. The case 3 and the cover 4 are molded by an aluminum die-casting method using a mold.

In the case of the electronic control device 1 including an electronic component that does not require heat dissipation or shielding, the material of the case 3 and the cover 4 may be resin. In the case of resin, the case 3 is molded by an injection molding method.

As illustrated in FIG. 1, the external shape of the electronic control device 1 is 260 mm×240 mm, which is relatively large in size and rectangular among electronic control devices 1 disposed in engine rooms.

The outer peripheral portion of the cover 4 is provided with a first groove portion 31 that can be filled with the sealing material 5. The sealing material 5 is applied between the first groove portion 31 provided in the cover 4 and a case protrusion 33 (see FIG. 3), the case protrusion 33 is buried in the sealing material 5, the case 3 and the cover 4 are fixed, and the inside of a housing is sealed, whereby the electronic components are protected from foreign substances such as salt water. The material of the cover 4 is preferably metal, and is preferably aluminum. The cover 4 is preferably molded by an aluminum die-casting method using a mold.

The sealing material 5 is preferably a silicon adhesive. In particular, since the electronic control device 1 is assumed to be mounted in an engine room and has a completely sealed structure, an internal pressure is applied to the electronic control device 1 due to a change in pressure in the electronic control device 1 due to a change in the temperature in the housing, and the center of the electronic control device 1 is curved outward and deformed. Therefore, the center of the long side of the electronic control device 1 is deformed the most. Therefore, the sealing material 5 has an adhesive strength that can withstand deformation. In addition, since outgas is generated at the time of curing of the sealing material 5, the outgas needs to be discharged to the outside of the housing.

In the present embodiment, since the size is 1.5 times larger than that of a conventional electronic control device 1, a metal material is selected for the cover 4, and the cover 4 has a thickness that is not plastically deformed to secure strength.

Figure 2:
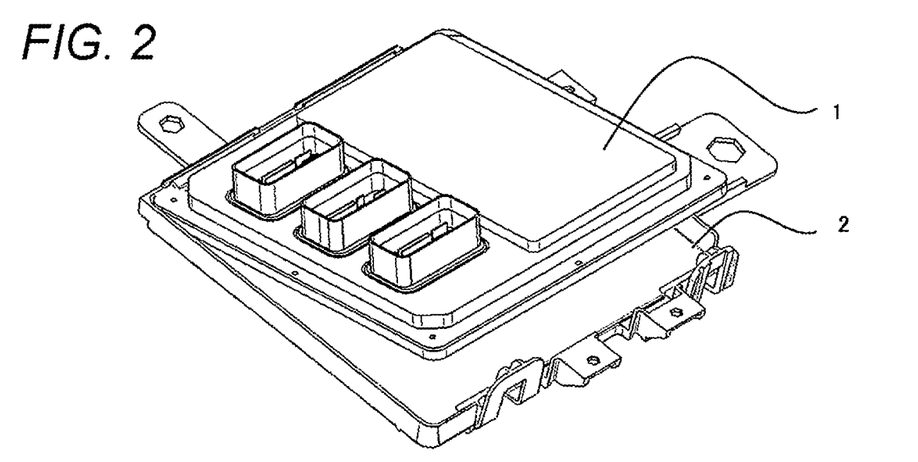
FIG. 2 is a view of attachment of a bracket to the electronic control device according to Example 1 of the present invention.

FIG. 2 is a view of attachment of a bracket 2 to the electronic control device 1 according to Example 1 of the present invention.

The bracket 2 is in contact with three surfaces of outer peripheral flat portions 32 and a side surface 9 of the electronic control device 1 described with reference to FIG. 1, and the electronic control device 1 is fixed by the bracket 2. The attached bracket 2 is assembled to an engine room of a vehicle. Since the shape of the bracket 2 is changed depending on the mounting position and mounting method in the engine room, there are variations of the bracket 2 such as an object to be fixed to the vehicle with bolts at four fixing points, an object to be fixed by insertion or the like to reduce the number of fixing bolts, and the bracket 2 used in FIG. 3 is one of the objects, for example.

Figure 3:
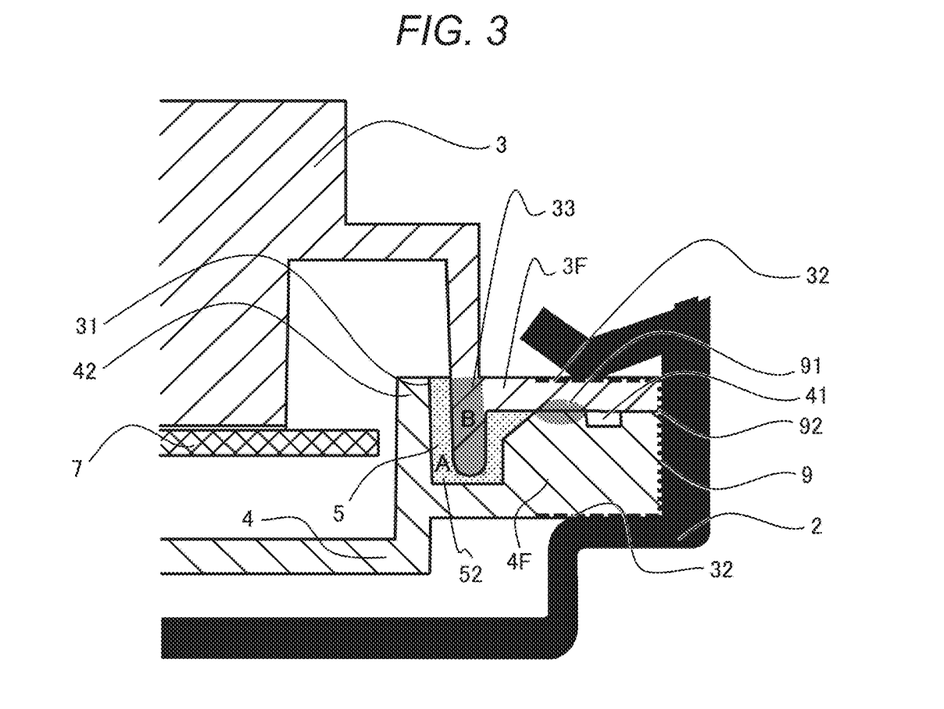
FIG. 3 is a cross-sectional view of a main part of the electronic control device according to Example 1 of the present invention.

FIG. 3 is a cross-sectional view of a main part of the electronic control device 1 according to Example 1 of the present invention.

The first groove portion 31 of the cover 4 is filled with the sealing material 5, and the case protrusion 33 is buried in the sealing material 5, whereby the case 3 and the cover 4 are assembled and have a waterproof function. In order to protect the printed wiring substrate 7, the first groove portion 31 of the cover 4 is provided around the outer periphery of the cover 4, and has a completely airtight structure. In the case 3 and the cover 4, the bracket 2 attachment surface (flat portions 32) to which the bracket 2 is assumed to be attached has a contact portion 91 in which the case 3 and the cover 4 face each other and are flush with each other, and in particular, has a contact portion 91 in which the case 3 and the cover 4 face each other and are flush with each other at a position that is closer to the outside than the first groove portion 31 of the cover 4 is. Therefore, it is not possible to visually confirm whether or not the sealing material 5 filled is present or not from the side surface 9 formed on the outer end surface of the contact portion 91.

However, since the case 3 and the cover 4 are large in size, distortion occurs between the case 3 and the cover 4, and the case 3 and the cover 4 are not completely in contact with each other, and there is a gap in a minute view. In addition, in the electronic control device 1, since it is necessary to secure the flat portions 32 of the case 3 and the cover 4 in parallel by about 10 mm as attachment of the bracket 2, the flat portions 32 of about 10 mm are provided in the case 3 and the cover 4. In addition, in order to fix the flat portions 32 of the case 3 and the cover 4 by bringing the bracket 2 into contact with the upper and lower flat portions 32, a low-profile shape having a thickness of about 10 mm when the case 3 and the cover 4 are in contact with each other while facing each other is adopted, and the shape is a shape in which the bracket 2 is assumed to be attached by bringing the bracket 2 into contact with the flat portions of the case 3 and the cover 4 and the side surfaces 9 of the case 3 and the cover 4.

Therefore, if the distance from the first groove portion 31 of the cover 4 to a salt water infiltration location 92 is about 10 mm and the sealing material 5 is not filled, crevice corrosion may occur due to the retention of salt water, and corrosion resistance may decrease. Therefore, it is necessary to secure a design value of a sealing creepage distance by adjusting the amount of the sealing material 5 so that the sealing material 5 is filled up to the vicinity of the salt water infiltration location 92. The vicinity of the salt water infiltration location 92 indicates the vicinity of the side surfaces 9 in contact with the bracket 2.

The bracket 2 has a structure in which the flat portion 32 provided on the outer peripheral portion of the case 3 and the flat portion 32 provided on the cover 4 are sandwiched from above and below. As a countermeasure against vibration of the vehicle, the electronic control device 1 is brought into contact with a wide surface to increase the contact area and increase the fitting force. In order to secure the bracket 2 attachment surface described above on the case 3 and the cover 4, it is important to secure a large area on the three surfaces of the flat portion 32 of the case 3, the flat portion 32 of about 10 mm of the cover 4, and the side surface 9 having a thickness of about 10 mm formed by assembling the case 3 and the cover 4. When the side surface 9 is formed by an aluminum die-casting method, the side surface 9 tapers, so that portions in the vicinity of the contact point between the case 3 and the cover 4 are flush with each other and in contact with the bracket 2. It is preferable to increase the area for both side surfaces 9 of the case 3 and the cover 4 to come into contact with each other.

In order to solve the problem of outflow of the sealing material 5 to the side surfaces 9 of the case 3 and the cover 4 in the above shape, the contact portion 91 that is present at a position that is closer to the outside than the first groove portion 31 of the cover 4 is and where the case 3 and the cover 4 face each other and are flush with each other is provided with a second groove portion 41 to be filled with the extra sealing material 5 pushed out when the case 3 and the cover 4 are assembled. By filling the second groove portion 41 with the extra sealing material 5, the sealing material 5 is prevented from flowing out to the side surfaces 9 of the case 3 and the cover 4.

Since the sealing material 5 filled in the first groove portion 31 and having a volume corresponding to the cross-sectional area A (mm$^2$) 52 flows out to the second groove portion 41 by a volume corresponding to a cross-sectional area B (mm$^2$) 33 of the protrusion of the case 3 buried in the sealing material 5, the second groove portion 41 of the cover 4 has a depth and an area enabling the second groove portion 41 to be filled with the sealing material 5 flowing out by a volume corresponding to A (mm$^2$)–B (mm$^2$)≤$X_1$ (mm$^2$) 41. In order to prevent corrosion of the side surfaces 9 of the case 3 and the cover 4 from the salt water infiltration location 92, it is necessary to provide the second groove portion 41 as close to the salt water infiltration location 92 as possible.

By filling the sealing material 5 up to the vicinity of the salt water infiltration location 92, a sealing creepage distance can be set to be long, and crevice corrosion at the salt water infiltration location 92 can be prevented, and corrosion resistance can be improved. In addition, in order to prevent the sealing material 5 flowing out from the first groove portion 31 from flowing out to the printed wiring substrate 7 side, the second groove portion 41 or the wall 42 that is higher than the contact portion 91 where the case 3 and the cover 4 face each other and are flush with each other is provided in the first groove portion 31 only on the printed wiring substrate 7 side, and has a shape that prevents the sealing material 5 from flowing out.

In the present embodiment, as illustrated in FIG. 3, an edge on the bracket side of a surface where a first flange 4F of the cover 4 (first housing) and a second flange 3F of the case 3 (second housing) are in contact with each other is in contact with the inner peripheral surface of the bracket 2. The side surfaces of the first flange 4F and the second flange 3F are flush with each other and are in contact with the inner peripheral surface of the bracket 2. As a result, the first flange 4F and the second flange 3F are restricted from moving in the upper, lower, and right directions in FIG. 3, and are firmly held by the bracket 2. The fact that the side surfaces of the first flange 4F and the second flange 3F are flush with each other means that the side surface of the first flange 4F and the side surface of the second flange 3F are continuous, and the side surface of the first flange 4F and the side surface of the second flange 3F are not limited to being present on the same plane. For example, even when the side surface of the first flange 4F and the side surface of the second flange 3F have a draft angle, they can be said to be flush if they are connected. The product dimensions are the same regardless of the presence or absence of the draft angle.

The width of the surface where the first flange 4F and the second flange 3F are in contact with each other is larger than the width of the first groove portion 31. Accordingly, the sealing creepage distance can be secured. The depth of the first groove portion 31 from the surface where the first flange 4F and the second flange 3F are in contact with each other is larger than the depth of the second groove portion 41. As a result, the case protrusion 33 is buried in the sealing material 5 filled in the first groove portion 31, and the case protrusion 33 and the first groove portion 31 are reliably sealed.

Figure 4:
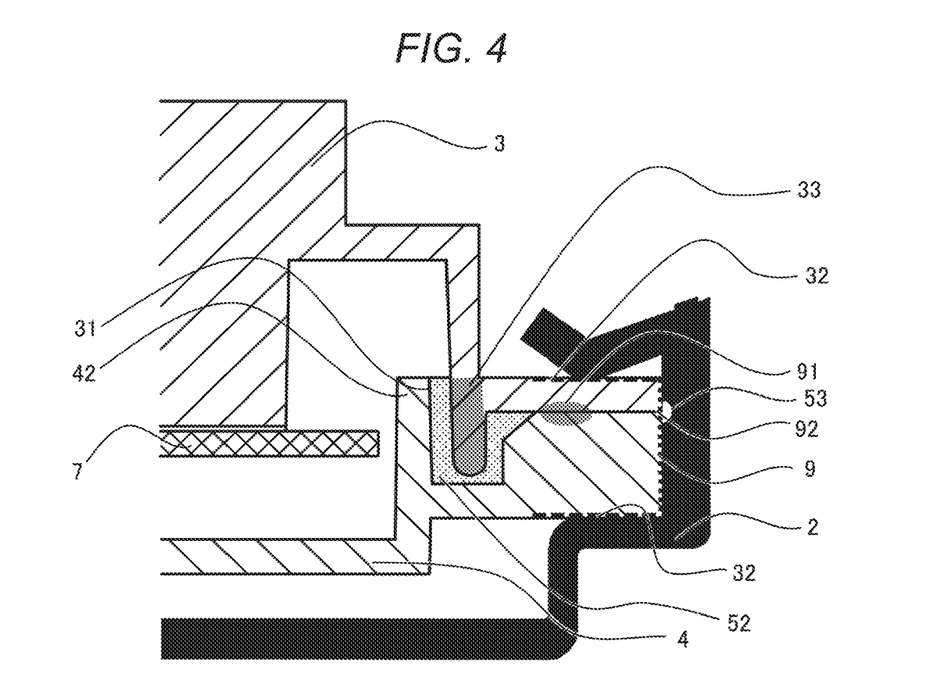
FIG. 4 is a cross-sectional view of the main part of the electronic control device according to Example 1 of the present invention, and is a diagram for explaining outflow of a sealing material to the outside.

FIG. 4 is a cross-sectional view of a main part of the electronic control device 1 according to Example 1 of the present invention, and is a diagram for explaining the outflow of the sealing material 5 to the outside. Note that FIG. 4 corresponds to a cross-sectional view taken along a section perpendicular to a portion (the first flange 4F and the second flange 3F) of the electronic control device 1 sandwiched by the bracket 2.

Since the idea described with reference to FIG. 3 is not adopted, the sealing material 5 filled in the first groove portion 31 has a cross-sectional area A (mm$^2$) 52, the protrusion of the case 3 buried in the sealing material 5 has a cross-sectional area B (mm$^2$) 33, and the sealing material 5 flows out by a volume corresponding to A (mm$^2$)–B (mm$^2$)≤$X_1$ (mm$^2$) 41 to the side surfaces 9 of the case 3 and the cover 4 through the space of the contact portion 91 where the case 3 and the cover 4 face each other and are flush with each other.

As a result, the sealing material 5 having a volume corresponding to $X_1$ (mm$^2$) 41 flowing out to the side surfaces 9 of the case 3 and the cover 4 has the shape of a sealing material protrusion 53, resulting in a dimensional defect. In addition, since the protruding shape affects the attachment of the bracket 2 and may lead to defective attachment, it is necessary to control the outflow of the sealing material 5 to the side surfaces 9 of the case 3 and the cover 4. As a method of controlling the outflow, the outflow of the sealing material 5 to the side surfaces 9 can be prevented by adjusting the amount of the sealing material 5 to be applied, but since the viscosity of the sealing material 5 varies depending on the lot or the use environment temperature, it is difficult to control the outflow of the sealing material 5 by condition setting, and it is necessary to adopt the idea described in FIG. 3 in order to solve any problem.

As illustrated in FIG. 3, the electronic control device 1 to be attached to the bracket 2 of the present Example includes the cover 4 (first housing) and the case 3 (second housing) fitted thereto. The cover 4 (first housing) includes the first flange 4F and the first groove portion 31 filled with the sealing material 5. The case 3 (second housing) includes the second flange 3F overlapping the first flange 4F, and the case protrusion 33 (protrusion) fitted to the first groove portion 31 and embedded in the sealing material 5. The first flange 4F of the cover 4 (first housing) has the second groove portion 41 present at a position that is closer to the outside than the first groove portion 31 is. An example in which a second groove portion is provided in the second flange 3F of the case 3 (second housing) will be described later with reference to FIG. 8. As a result, it is possible to suppress the sealing material from flowing out to the outside and to reduce defective attachment of the bracket. Although the first flange 4F and the second flange 3F are to be supported by the bracket 2 outside the electronic control device 1, the bracket 2 is not a component of the electronic control device 1.

Figure 5:
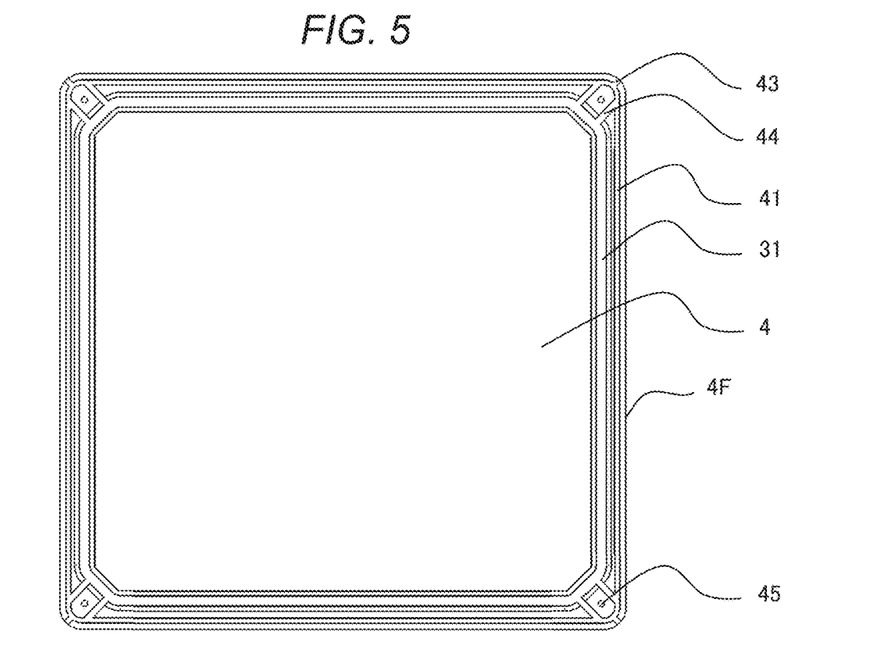
FIG. 5 is a plan view of a cover that is a main part of the electronic control device according to Example 1 of the present invention.

FIG. 5 is a plan view of the cover 4 that is a main part of the electronic control device 1 according to Example 1 of the present invention.

Since the electronic control device 1 has a shape assuming the attachment of the bracket 2 and has a structure capable of improving corrosion resistance, the electronic control device 1 has a shape having the contact portion 91 where the case 3 and the cover 4 face each other and are flush with each other. Therefore, in the comparative example illustrated in FIG. 4, after the case 3 and the cover 4 are assembled, it is necessary to disassemble and break the assembled case 3 and cover 4 to confirm whether the sealing material 5 filled is present or not. Alternatively, when the sealing material 5 flows out to the side surfaces 9 of the case 3 and the cover 4, it is possible to confirm that the sealing material 5 is correctly applied to the first groove portion 31 of the cover 4 or whether the sealing material 5 filled is present or not.

However, as described above, when the sealing material 5 flows out to the side surfaces 9 to which the bracket 2 is attached, this leads to defective attachment of the bracket 2. Therefore, in order to avoid flowing out to the side surfaces 9, a third groove portion 43 connected to the second groove portion 41 of the cover 4 is provided. The third groove portion 43 is provided so as to communicate with the side surfaces 9 of the case 3 and the cover 4. In other words, the first flange 4F illustrated in FIG. 5 has the third groove portion 43 allowing the second groove portion 41 to communicate with the outside. The third groove portion 43 has an open end in a side surface (a side surface of a corner portion) of the first flange 4F. An example in which a third groove portion is provided in the second flange 3F of the case 3 (second housing) will be described later with reference to FIG. 9.

The second groove portion 41 of the cover 4 is filled with the extra sealing material 5 flowing out from the first groove portion 31 of the cover 4, and the sealing material 5 filled in the second groove portion 41 of the cover 4 partially overflows to the side surfaces 9 of the case 3 and the cover 4 through the third groove portion 43 of the cover 4. By visually confirming the overflowed outflow portion, the operator can confirm whether the sealing material 5 filled is present or not in a non-destructive manner even at the manufacturing site.

In order to cause the sealing material 5 to overflow from the third groove portion 43, the second groove portion 41 in the vicinity of the third groove portion 43 is preferentially filled with the sealing material 5. Therefore, a guide groove portion 44 that allows the first groove portion 31 and the second groove portion 41 to communicate with each other may be provided in the vicinity of a screw hole 45 of the cover 4 at a corner used for fixing the case 3 and the cover 4. In other words, the first flange 4F illustrated in FIG. 5 has the guide groove portion 44 that allows the first groove portion 31 and the second groove portion 41 to communicate with each other. An example in which a guide groove portion is provided in the second flange 3F of the case 3 (second housing) will be described later with reference to FIG. 9.

In the third groove portion 43, in a case where the sealing material 5 is cured by applying heat, outgas is generated at the time of curing the sealing material 5, so that the outgas can be discharged to the outside of the housing from the third groove portion 43.

Figure 6:
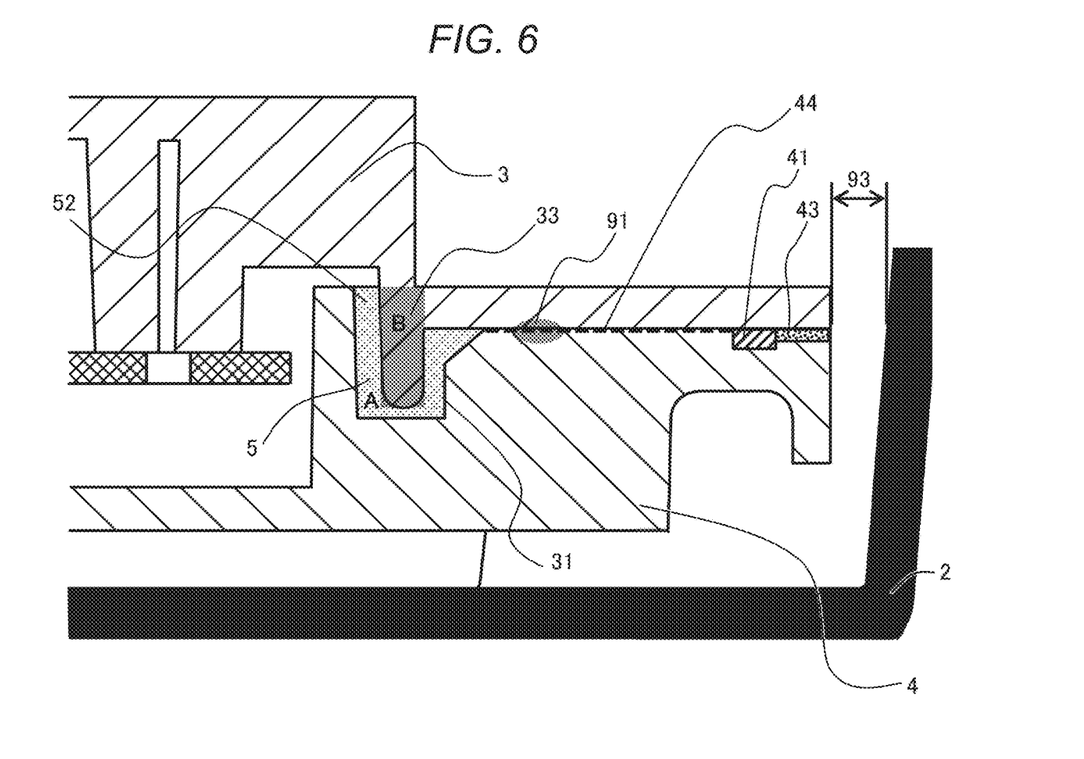
FIG. 6 is a cross-sectional view of a third groove portion of amain part of the electronic control device according to Example 1 of the present invention.

FIG. 6 is a cross-sectional view of the third groove portion 43 of a main part of the electronic control device 1 according to Example 1 of the present invention. Note that FIG. 6 corresponds to a cross-sectional view of the electronic control device 1 taken along a diagonal line of the cover 4 illustrated in FIG. 5. In FIG. 6, in order to simplify the description, the screw hole 45 is omitted.

The sealing material 5 filled in the first groove portion 31 has a cross-sectional area A (mm$^2$) 52, the protrusion of the case 3 buried in the sealing material 5 has a cross-sectional area B (mm$^2$) 33, and the sealing material 5 flows out by a volume corresponding to A (mm$^2$)–B (mm$^2$)≤X$_1$ (mm$^2$) 41 to the side surfaces 9 of the case 3 and the cover 4 through the space of the contact portion 91 where the case 3 and the cover 4 face each other and are flush with each other.

The third groove portion 43 of the cover has a depth and an area that can be filled with the sealing material 5 having a volume corresponding to X$_1$ (mm$^2$) 41≤X$_2$ (mm$^2$) 43 so that the sealing material 5 having a volume corresponding to X$_1$ (mm$^2$) 41 stored in the second groove portion 41 may flow out to the outside through the third groove portion 43. Preferably, the cross-sectional area of the third groove portion 43 illustrated in FIG. 6 is set to X$_2$ (mm$^2$) 43 or more. In the present embodiment, the depth of the second groove portion 41 from the surface where the first flange 4F and the second flange 3F are in contact with each other is larger than the depth of the third groove portion 43.

Figure 7:
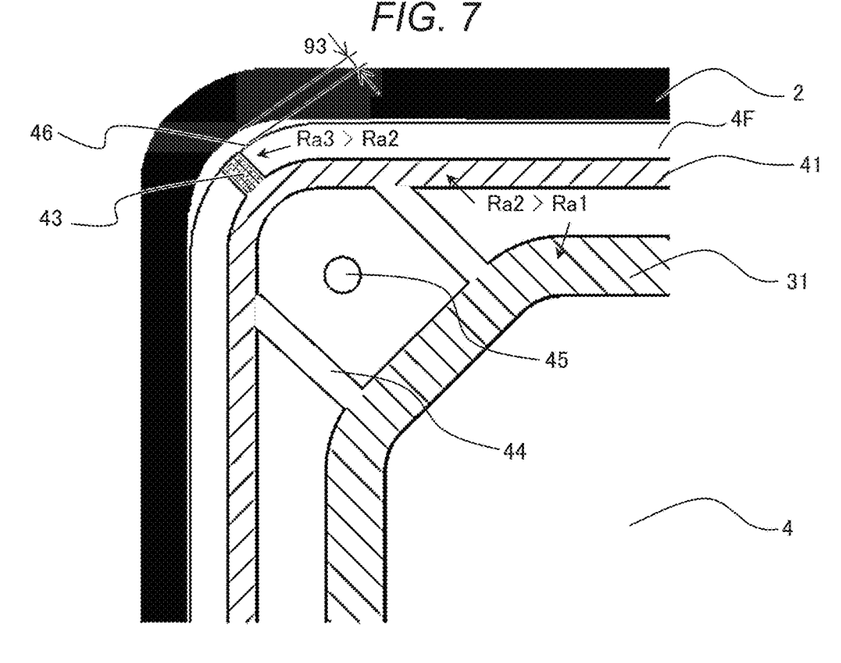
FIG. 7 is a plan view of a main part of the electronic control device according to Example 1 of the present invention.

In order to cause the sealing material 5 to overflow from the third groove portion 43 and to preferentially fill the second groove portion 41 in the vicinity of the third groove portion 43 with the sealing material 5, the guide groove portion 44 allowing the first groove portion 31 and the second groove portion 41 to communicate with each other may be provided in the vicinity of the screw hole 45 at a corner of the cover 4 used for fixing the case 3 and the cover 4 (see FIG. 7). Further, on the side surface 9 (adjacent to the corner of the cover 4) where the sealing material 5 overflows from the third groove portion 43, there is a gap 93 between the bracket 2 and the electronic control device (the cover 4 in FIG. 7).

In order to improve the fluidity of the sealing material 5 in the first groove portion 31 and suppress the fluidity in the second groove portion 41, the surface roughness Ra2 of the second groove portion 41 is made coarser than the surface roughness Ra1 of the first groove portion 31. The surface roughness Ra3 of the third groove portion 43 can be made coarser than the surface roughness Ra2 of the second groove portion 41.

FIG. 7 is a plan view of a main part of the electronic control device 1 according to Example 1 of the present invention.

In the bracket 2 attached to the outer periphery of the electronic control device 1, it is difficult to manufacture the bracket 2 according to the shape of the electronic control device 1, such as an R portion 46 or the like of the corner of the electronic control device 1. Therefore, the bracket 2 does not come into contact with the electronic control device 1 on all surfaces, and the gap 93 between the bracket and the electronic control device is provided such that a portion of the bracket 2 does not come into contact with the outer periphery of the electronic control device 1.

The third groove portion 43 connected to the second groove portion 41 is provided in the cover 4 so that the sealing material 5 overflows only at a portion of the portion not in contact with the bracket 2. In other words, the third groove portion 43 illustrated in FIG. 7 is provided at a corner portion of the first flange 4F. The corner portion has an R shape.

By providing the third groove portion 43 so as to communicate with (reach) the side surfaces 9 of the cover 3 and the cover 4, it is possible to partially overflow the sealing material 5 without affecting the attachment of the bracket 2. In addition, outgas generated when the sealing material 5 is cured may be discharged from the third groove portion 43. In addition, in order to make the surface roughness of the surfaces smooth and make the sealing material 5 easy to flow out, shaving by partial machining may be used as a method of forming the second groove portion 41 and the third groove portion 43.

In the present Example, the first flange 4F illustrated in FIG. 7 has the screw hole 45 (hole) through which a screw (fixing member) is inserted at the corner portion. Two guide groove portions 44 are provided at one corner portion, and are disposed so as to sandwich a screw hole 45. As a result, the sealing material 5 is guided from the first groove portion 31 to the third groove portion 43 via the guide groove portion 44. Even if the sealing material 5 leaks from the third groove portion 43 to the gap 93, there is a low possibility that the leaking sealing material 5 interferes with the bracket 2.

According to the present Example, even in the electronic control device 1 in which it is difficult to confirm whether the sealing material 5 filled is present or not in a non-destructive manner and the case 3 and the cover 4 are required to be flush with each other and to which the bracket 2 is assumed to be attached, it is possible to prevent defective attachment of the bracket 2 due to outflow of the sealing material 5, and it is possible to confirm whether the sealing material 5 filled is present or not in an early stage in a non-destructive manner even at the manufacturing site.

EXAMPLE 2

Figure 8:
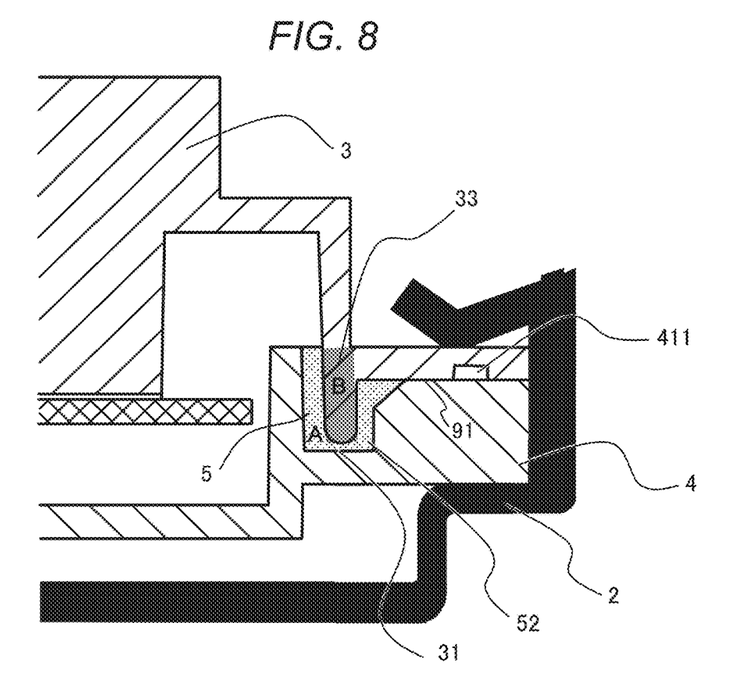
FIG. 8 is a cross-sectional view of a main part of an electronic control device according to Example 2 of the present invention.

FIG. 8 is a cross-sectional view of a main part of an electronic control device 1 according to Example 2 of the present invention. The present Example is different from Example 1 in that a second groove portion is provided in a case 3 instead of a cover 4.

A sealing material having a volume corresponding to a cross-sectional area A (mm$^2$) 52 and filled in a first groove portion 31 of the cover 4 flows out to a second groove portion 411 by a volume corresponding to a cross-sectional area B (mm$^2$) 33 of a protrusion of the case 3 buried in the sealing material 5. Therefore, the second groove portion 411 having a depth and an area that can be filled with the sealing material 5 flowing out by a volume corresponding to A (mm$^2$)–B (mm$^2$)≤X$_1$ (mm$^2$) 411 is provided on the case 3 side. The second groove portion 411 provided on the case 3 side is filled with the extra sealing material 5 corresponding to X$_1$ (mm$^2$) 411 to prevent the sealing material 5 from flowing out to side surfaces 9 of the case 3 and the cover 4. Other configurations are the same as those of the electronic control device 1 according to Example 1.

Figure 9:
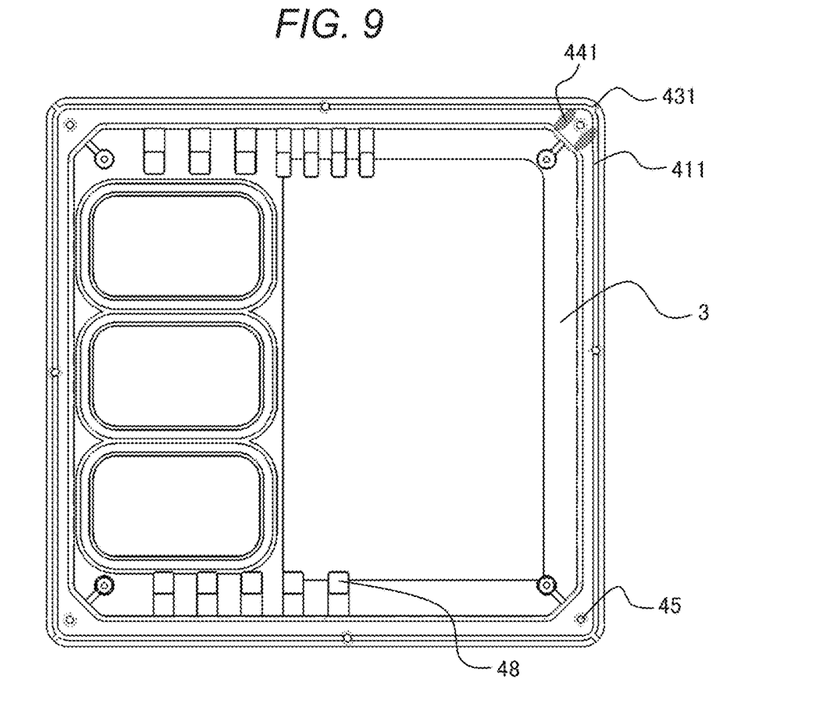
FIG. 9 is a plan view of a case that is a main part of the electronic control device according to Example 1 of the present invention.

FIG. 9 is a plan view of the case 3 that is a main part of the electronic control device 1 according to Example 2 of the present invention.

A third groove portion 431 connected to the second groove portion 411 is provided in the case 3. The sealing material 5 having a volume corresponding to X$_1$ (mm$^2$) 411 flows out to the second groove portion 411, and further flows out to the outside through the third groove portion 431. The third groove portion 431 has a depth and an area that can be filled with the sealing material 5 having a volume corresponding to X$_2$ (mm$^2$) 431. Preferably, the cross-sectional area of the third groove portion 43 is set to X$_2$ (mm$^2$) 43 or more. The third groove portion 431 is provided so as to communicate with the side surfaces 9 of the case 3 and the cover 4.

The second groove portion 411 of the case 3 is filled with the extra sealing material 5 having a volume corresponding to X$_1$ (mm$^2$) 411 flowing out of the first groove portion 31 of the cover 4, and a part of the sealing material 5 filled in the second groove portion 411 overflows to the side surfaces 9 of the case 3 and the cover 4 through the third groove portion 431 of the case 3. By visually confirming the outflow portion where the sealing material 5 overflows, the operator can confirm whether the sealing material 5 filled is present or not in a non-destructive manner even at the manufacturing site.

In order to cause the sealing material 5 to overflow from the third groove portion 431, the second groove portion 411 in the vicinity of the third groove portion 431 is preferentially filled with the sealing material 5. Therefore, a guide groove portion 441 allowing the first groove portion 311 and the second groove portion 411 to communicate with each other may be provided in the vicinity of the screw hole 45 of the cover 4 at a corner used for fixing the case 3 and the cover 4.

Other configurations are the same as those of the electronic control device 1 according to Example 1.

According to the present Example, even in the electronic control device 1 in which it is difficult to confirm whether the sealing material 5 filled is present or not in a non-destructive manner and that has a contact portion 91 where the case 3 and the cover 4 face each other and are flush with each other and to which a bracket 2 is assumed to be attached, it is possible to prevent defective attachment of the bracket 2 due to outflow of the sealing material 5, and it is possible to confirm whether the sealing material 5 filled is present or not in an early stage in a non-destructive manner even at the manufacturing site.

EXAMPLE 3

Figure 10A:
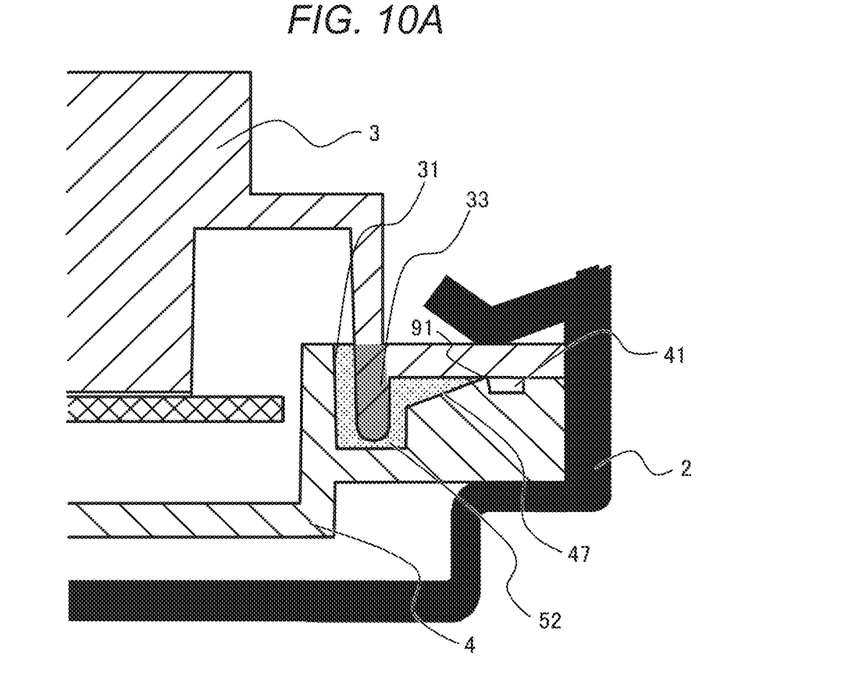
FIG. 10A is a cross-sectional view of a main part of an electronic control device according to Example 3 of the present invention.

FIG. 10A is a cross-sectional view of a main part of an electronic control device 1 according to Example 3 of the present invention.

In this Example, a contact portion 91 where a case 3 and a cover 4 face each other and are flush each other has an inclination 47 extending from a first groove portion 31 to a second groove portion 41 of the cover 4 only in the vicinity of a third groove portion 43 and communicates with the second groove portion 41, so that a sealing material 5 is filled up to the third groove portion 43 via the second groove portion 41. For example, the inclination 47 that has an angle of about 30 degrees whereas a normal angle is about 45 degrees is provided in a part of the contact portion 91 where the case 3 and the cover 4 face each other and are flush with each other such that the third groove portion 43 is filled. Other configurations are the same as those of the electronic control device 1 according to Example 1.

In other words, the upward inclination 47 (first inclination) is provided outward between the first groove portion 31 and the second groove portion 41.

In this Example, the sealing material 5 flowing out from the first groove portion 31 of the cover 4 easily flows out to the second groove portion 41, and the sealing material 5 flows out from the third groove portion 43 to the outside through the second groove portion 41 from, for example, an R portion 46 (see FIG. 7) that does not affect the attachment of a bracket 2. Other operations and effects are the same as those of the electronic control device 1 according to Example 1.

Modification

Figure 10B:
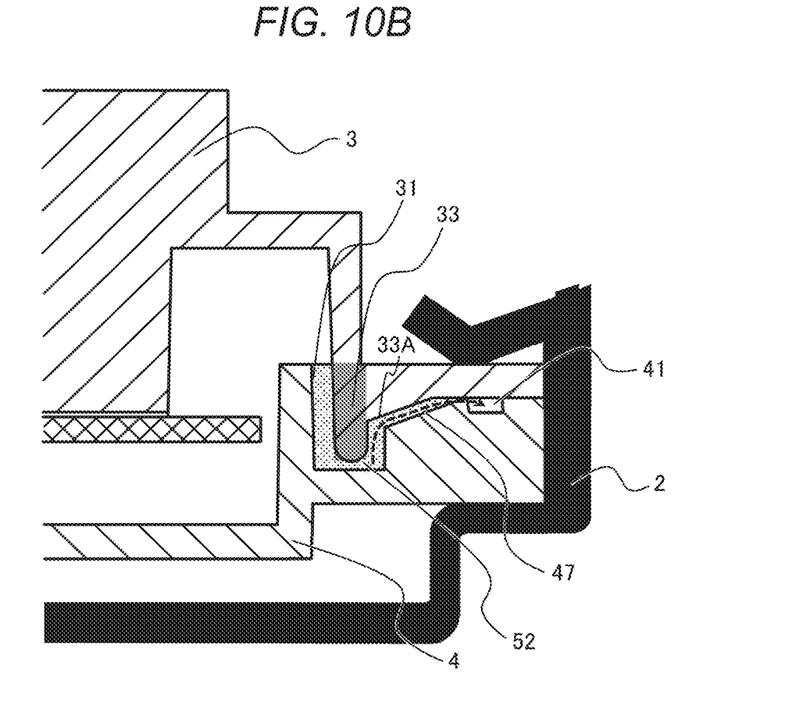
FIG. 10B is a cross-sectional view of a main part of an electronic control device according to a modification of Example 3 of the present invention.

As illustrated in FIG. 10B, an inclination 33A may be provided in the case 3 so as to be parallel to the inclination 47 of the cover 4. In other words, the inclination 33A (second inclination) facing the inclination 47 (first inclination) is provided at a connection portion between a case protrusion 33 (protrusion) of the case 3 (second housing) and a second flange 3F. As a result, as indicated by a dotted arrow in FIG. 10B, the sealing material 5 easily flows out from the first groove portion 31 to the second groove portion 41, and then flows out from the second groove portion 41 to the third groove portion 43.

EXAMPLE 4

Figure 11:
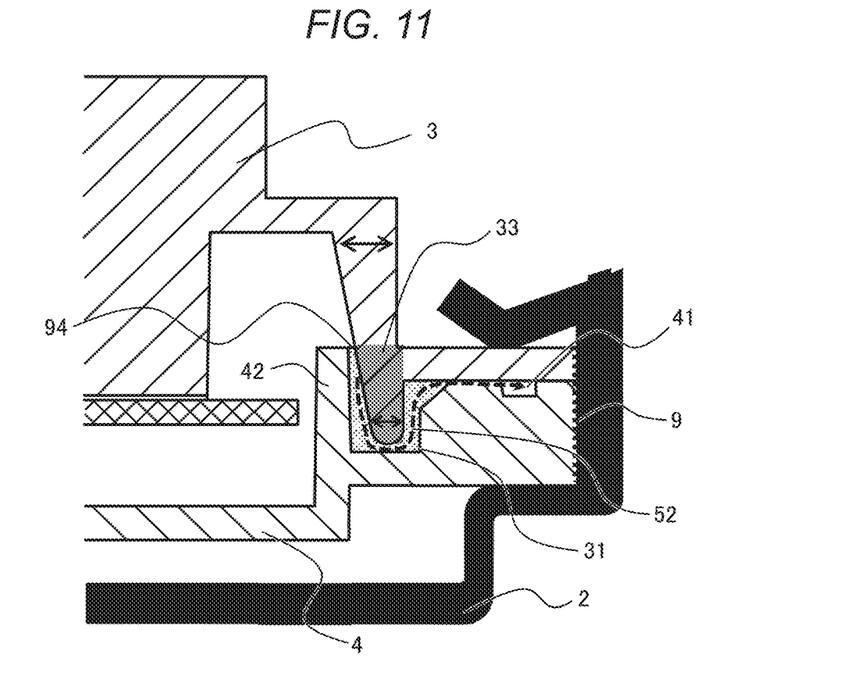
FIG. 11 is a cross-sectional view of a main part of an electronic control device according to Example 4 of the present invention.

FIG. 11 is a cross-sectional view of a main part of an electronic control device 1 according to Example 4 of the present invention.

In this Example, a first groove portion 31 of a cover 4 is filled with a sealing material 5, and a case protrusion 33 is buried in the sealing material 5. The shape of the case protrusion 33 buried in the sealing material 5 is a shape that becomes thinner toward the tip of the protrusion, and has a shape in which a clearance 94 between a wall 42 and the case protrusion 33 is narrowed.

In other words, the wall 42 higher than a surface on which a first flange 4F and a second flange 3F are in contact with each other is provided at a position that is closer to an inside than first groove portion 31 is, and the case protrusion 33 (protrusion) of the case 3 (second housing) becomes thinner toward the tip. The clearance between the case protrusion 33 and the wall 42 becomes narrower toward the base of the case protrusion 33.

When the case protrusion 33 is molded by an aluminum die-casting method, the protrusion base may be tapered to increase the cross-sectional area B (mm$^2$) 33 of the protrusion of the case 3. Since the sealing material 5 filled in the first groove portion 31 has a cross-sectional area A (mm$^2$) 52, the protrusion of the case 3 buried in the sealing material 5 has a cross-sectional area B (mm$^2$) 33, and the sealing material 5 flows out by a volume corresponding to A (mm$^2$)−B (mm$^2$)≤X$_1$ (mm$^2$) 41 to side surfaces 9 of the case 3 and the cover 4 through a space of a contact portion 91 where the case 3 and the cover 4 face each other and are flush with each other, the cross-sectional area B (mm$^2$) 33 of the case protrusion 33 is increased to increase the sealing material 5 having a volume corresponding to X$_1$ (mm$^2$) 41 and flowing out to the second groove portion 41 so as to cause the sealing material 5 to flow out to the outside from the third groove portion 43. Other configurations are the same as those of the electronic control device 1 according to Example 1.

In this Example, when the case protrusion 33 is buried in the sealing material 5 filled in the first groove portion 31 of the cover 4, it is possible to prevent the sealing material 5 from flowing out toward the printed wiring substrate 7 side on the inner side of the first groove portion 31 of the cover 4. In addition, as indicated by a dotted arrow in FIG. 11, the sealing material 5 flowing out from the first groove portion 31 of the cover 4 easily flows out to the second groove portion 41, and the sealing material 5 flows out from the third groove portion 43 via the second groove portion 41. Other operations and effects are the same as those of the electronic control device 1 according to Example 1.

EXAMPLE 5

Figure 12:
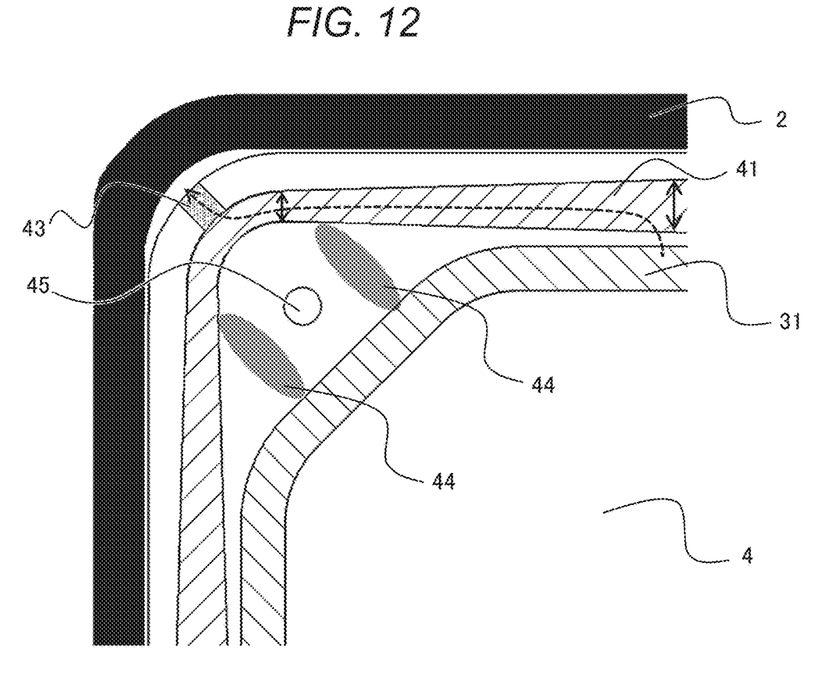
FIG. 12 is a plan view of a case that is a main part of an electronic control device according to Example 5 of the present invention.

FIG. 12 is a plan view of a cover 4 that is a main part of an electronic control device 1 according to Example 5 of the present invention.

In this embodiment, the shape of a second groove portion 41 provided in a case 3 or a cover 4 so that a sealing material 5 flows out to a third groove portion 43 may not have a uniform width, and may have a shape in which a cross-sectional area of the second groove portion 41 is locally changed and which is thinner toward the third groove portion 43. For example, the second groove portion 41 illustrated in FIG. 12 becomes narrower toward a corner portion.

Alternatively, the shape of the third groove portion 43 may also be changed outward so that the sealing material 5 easily overflows to the outside.

In addition, in order to cause the sealing material 5 to overflow from the third groove portion 43 and to preferentially fill the second groove portion 41 in the vicinity of the third groove portion 43 with the sealing material 5, a guide groove portion 44 allowing a first groove portion 31 and the second groove portion 41 to communicate with each other may be provided in the vicinity of a screw hole 45 of the cover 4 at a corner used for fixing the case 3 and the cover 4. Other configurations are the same as those of the electronic control device 1 according to Example 1.

In this embodiment, in the vicinity of the third groove portion 43, the second groove portion 41 is filled with the sealing material 5 flowing out from the first groove portion 31 earlier than the center, and the sealing material 5 flows out from the third groove portion 43. Other operations and effects are the same as those of the electronic control device 1 according to Example 1.

EXAMPLE 6

Figure 13:
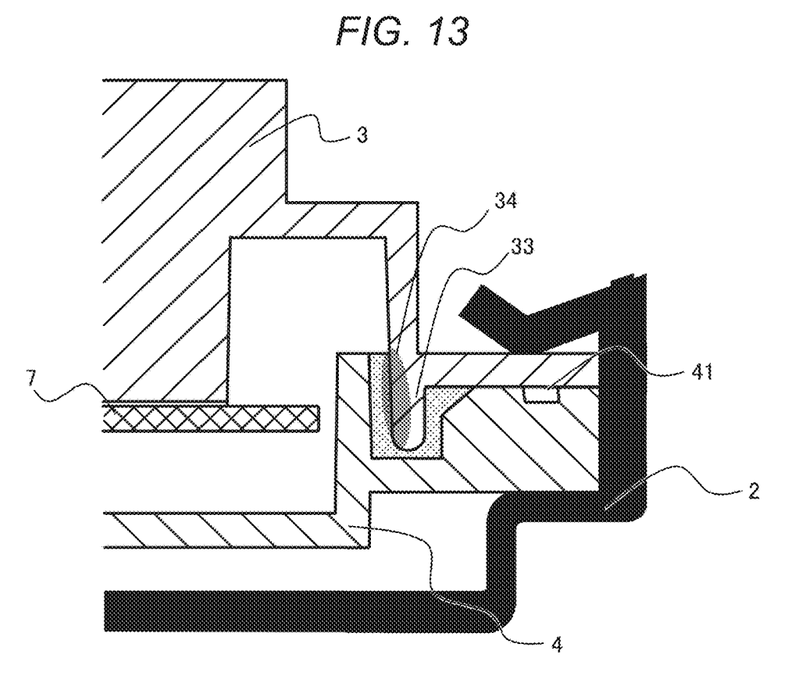
FIG. 13 is a cross-sectional view of a main part of an electronic control device according to Example 6 of the present invention.

FIG. 13 is a cross-sectional view of a main part of an electronic control device 1 according to Example 6 of the present invention.

In this Example, a first groove portion 31 of a cover 4 is filled with a sealing material 5, and a case protrusion 33 is buried in the sealing material 5. The surface roughness of the case protrusion 33 buried in the sealing material 5 has a shape of a rough surface 34, as compared with the other surfaces. Other configurations are the same as those of the electronic control device 1 according to Example 1.

In this Example, when the case protrusion 33 is buried in the sealing material 5 filled in the first groove portion 31 of the cover 4, it is possible to prevent the sealing material 5 having a volume corresponding to X$_1$ (mm$^2$) 41 flowing out from flowing out toward the printed wiring substrate 7 side on the inner side of a cover first groove. Other operations and effects are the same as those of the electronic control device 1 according to Example 1.

Note that the present invention is not limited to the above-described Examples and includes various modifications.

For example, the above-described Examples have been described in detail for easy understanding of the present invention, and are not necessarily limited to those having all the described configurations. In addition, a part of the configuration of a certain Example can be replaced with the configuration of another Example, and the configuration of a certain Example can be added to the configuration of another Example. In addition, for a part of the configuration of each Example, it is possible to add, delete, and replace another configuration.

Examples of the present invention may have the following aspects.

(1). An electronic control device 1 includes: a first housing (cover 4) in which a first groove into which a protrusion of a second housing (case 3) is inserted and that is filled with a seal member is formed; and a wiring substrate disposed between the second housing (case 3) and the first housing (cover 4) and having an electronic component mounted thereon, wherein a joint portion (contact portion 91) connected to the first groove and formed on an outer side of the first groove to join the second housing (case 3) and the first housing (cover 4) is provided, outer end surfaces (side surfaces 9) of the joint portion (contact portion 91) are formed to be flush with each other, a surface (flat portion 32) to which a bracket having an inner surface facing the outer end surfaces (side surfaces 9) is assumed to be attached is provided in the joint portion (contact portion 91), and a second groove connected to the joint surface (contact portion 91), formed on the outer side of the first groove, and filled with a sealing member is formed in the second housing (case 3) or the first housing (cover 4).

(2). In the electronic control device 1, the surface on which the bracket is assumed to be attached is formed inward from the inner peripheral surface and includes a first support portion that supports the joint portion from above.

(3). In the electronic control device 1, the surface on which the bracket is assumed to be attached is formed inward from the inner peripheral surface and includes a first support portion that supports the joint portion from below.

(4). In the electronic control device 1, a joining length of the joint portion is longer than a length from an inner surface to an outer surface of the first groove.

(5). In the electronic control device 1, a depth of the first groove from the joint surface is larger than a depth of the second groove from the joint surface.

(6). In the electronic control device 1, a third groove connected to the second groove and communicating with an outer end surface is formed in the first housing (cover 4).

(7). In the electronic control device 1, a depth of the second groove from the joint surface is larger than a depth of the third groove from the joint surface.

(8). In the electronic control device 1, the first housing (cover 4) has a corner portion formed by an R portion, and the third groove is formed in an outer end surface of the corner portion.

(9). In the electronic control device 1, the first housing (cover 4) is formed in a substantially quadrangular shape having four corner portions formed by R portions, and the third groove is formed on an outer end surface of any one of the four corner portions.

According to (1) to (9) described above, the flow of the sealing material is controlled in such a manner that the outflow of the sealing material to a bracket attachment surface is suppressed and the sealing material partially overflows to a portion that does not affect the attachment of the bracket, so that the amount of the sealing material filled can be visually confirmed at the manufacturing site, leading to improvement of the quality of the product. In addition, by improving the yield at the time of manufacturing, it is possible to improve the quality of products and reduce the cost of spoilage.

REFERENCE SIGNS LIST

1 electronic control device
2 bracket
3 case
31 first groove portion
32 flat portion
33 case protrusion, cross-sectional area B (mm$^2$) of protrusion
34 rough surface
4 cover
41 second groove portion, $X_1$ (mm$^2$)
411 second groove portion, $X_1$ (mm$^2$)
42 wall
43 third groove portion, $X_2$ (mm$^2$)
431 third groove portion, $X_2$ (mm$^2$)
44 guide groove portion
441 guide groove portion
45 screw hole
46 R portion
47 inclination
48 base
5 sealing material
51 connector sealing material
52 cross-sectional area A (mm$^2$)
53 sealing protrusion
6 connector
7 printed wiring substrate
8 heat dissipation adhesive
9 side surface
91 contact portion
92 salt water infiltration location
93 gap between bracket and electronic control device
94 clearance
3F second flange
4F first flange

The invention claimed is:

1. An electronic control device to be attached to a bracket, the electronic control device comprising: a first housing; and a second housing fitted to the first housing, wherein
the first housing includes
a first flange and
a first groove portion filled with a sealing material,
the second housing includes
a second flange overlapping the first flange and
a protrusion fitted to the first groove portion and embedded in the sealing material, and
the first flange or the second flange
includes a second groove portion at a position that is closer to an outside than the first groove portion is, and
an edge of a surface that is on a bracket side and where the first flange and the second flange are in contact with each other is in contact with an inner peripheral surface of the bracket.

2. The electronic control device according to claim 1, wherein
side surfaces of the first flange and the second flange are flush with each other and in contact with the inner peripheral surface of the bracket.

3. The electronic control device according to claim 2, wherein
a width of the surface where the first flange and the second flange are in contact with each other
is larger than a width of the first groove portion.

4. The electronic control device according to claim 1, wherein a depth of the first groove portion from the surface where the first flange and the second flange are in contact with each other is larger than a depth of the second groove portion.

5. The electronic control device according to claim 1, wherein
the first flange or the second flange
includes a third groove portion allowing the second groove portion to communicate with the outside.

6. The electronic control device according to claim 5, wherein
the third groove portion
includes an open end on a side surface of the first flange or of the second flange.

7. The electronic control device according to claim 5, wherein
a depth of the second groove portion from the surface where the first flange and the second flange are in contact with each other is larger than a depth of the third groove portion.

8. The electronic control device according to claim 5, wherein
the third groove portion
is provided at a corner portion of the first flange or of the second flange.

9. The electronic control device according to claim 5, wherein
the first flange or the second flange includes a guide groove portion allowing the first groove portion and the second groove portion to communicate with each other.

10. The electronic control device according to claim 9, wherein
the first flange or the second flange
has, at a corner portion, a hole through which a fixing member is inserted, and
the guide groove portion
has two guide groove portions disposed at the one corner portion so as to sandwich the hole.

11. The electronic control device according to claim 1, wherein
an upward first inclination toward the outside is provided between the first groove portion and the second groove portion.

12. The electronic control device according to claim 11, wherein
a second inclination facing the first inclination is provided at a connection portion between the protrusion and the second flange of the second housing.

13. The electronic control device according to claim 1, wherein
a wall higher than a surface where the first flange and the second flange are in contact with each other is provided at a position that is closer to an inside than the first groove portion is, and
the protrusion of the second housing
becomes thinner toward a tip, and
a clearance between the protrusion and the wall
becomes narrower toward a base of the protrusion.

14. The electronic control device according to claim 8, wherein
the second groove portion
becomes narrower toward the corner portion.

* * * * *